(12) United States Patent
Keung et al.

(10) Patent No.: US 11,366,753 B2
(45) Date of Patent: Jun. 21, 2022

(54) CONTROLLING PERFORMANCE OF A SOLID STATE DRIVE

(71) Applicant: Marvell Asia Pte, Ltd., Singapore (SG)

(72) Inventors: Ka-Ming Keung, San Jose, CA (US); Dung Viet Nguyen, San Jose, CA (US)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 16/525,105

(22) Filed: Jul. 29, 2019

(65) Prior Publication Data

US 2020/0042443 A1    Feb. 6, 2020

Related U.S. Application Data

(60) Provisional application No. 62/712,804, filed on Jul. 31, 2018.

(51) Int. Cl.

| G06F 12/00 | (2006.01) |
| G06F 12/06 | (2006.01) |
| G06F 12/02 | (2006.01) |
| G06F 3/06 | (2006.01) |
| G11C 11/409 | (2006.01) |

(52) U.S. Cl.
CPC .......... G06F 12/0646 (2013.01); G06F 3/064 (2013.01); G06F 3/0613 (2013.01); G06F 3/0679 (2013.01); G06F 12/0246 (2013.01); G11C 11/409 (2013.01)

(58) Field of Classification Search
CPC .... G06F 12/0646; G06F 3/0613; G06F 3/064; G06F 3/0679; G06F 12/0246; G11C 11/409
See application file for complete search history.

(56) References Cited

U.S. PATENT DOCUMENTS

| 9,519,590 | B1 * | 12/2016 | Armangau | ........... G06F 12/0866 |
| 9,760,392 | B1 * | 9/2017 | Dantkale | ............. G06F 9/45558 |
| 9,924,406 | B2 * | 3/2018 | Yang | ..................... H04W 16/04 |
| 2009/0089492 | A1 * | 4/2009 | Yoon | ..................... G06F 3/0628 |
| | | | | 711/E12.001 |

(Continued)

OTHER PUBLICATIONS

European Search Report for European Application No. 19189312.2, dated Jan. 7, 2020 (12 pages).

(Continued)

*Primary Examiner* — Shawn X Gu
*Assistant Examiner* — Mohammad S Hasan

(57) ABSTRACT

A storage access request to access a solid state drive (SSD) is received. A storage access timer is set with a time duration, where the time duration is based on a desired performance of the SSD. A non-volatile memory command associated with the storage access request is sent to non-volatile memory. The storage access timer is started. A determination is made whether the non-volatile memory completed execution of the non-volatile memory command after the storage access timer indicates that the time duration elapsed. An indication that the storage access request is complete is sent to a host if the non-volatile memory completed execution of the non-volatile memory command. Alternatively, the storage access timer is reset with the time duration if the non-volatile memory has not completed execution of the non-volatile memory command.

20 Claims, 7 Drawing Sheets

(56) References Cited

U.S. PATENT DOCUMENTS

| | | | | |
|---|---|---|---|---|
| 2009/0172213 | A1* | 7/2009 | Jayachandran | G06F 3/0679 |
| | | | | 710/19 |
| 2010/0169536 | A1* | 7/2010 | Shedel | G06F 9/45558 |
| | | | | 718/1 |
| 2012/0137059 | A1* | 5/2012 | Yang | G06F 3/0659 |
| | | | | 711/104 |
| 2012/0278819 | A1* | 11/2012 | Cho | G06F 13/385 |
| | | | | 719/325 |
| 2014/0372656 | A1* | 12/2014 | Sakurai | G06T 1/20 |
| | | | | 710/310 |
| 2016/0029402 | A1* | 1/2016 | Backholm | H04W 76/10 |
| | | | | 370/329 |
| 2016/0054774 | A1* | 2/2016 | Song | G06F 9/5094 |
| | | | | 713/320 |
| 2016/0179373 | A1* | 6/2016 | Erez | G11C 7/1045 |
| | | | | 711/154 |
| 2016/0212708 | A1* | 7/2016 | Kim | H04W 52/0216 |
| 2016/0330175 | A1* | 11/2016 | Li | H04L 63/0853 |
| 2017/0187640 | A1* | 6/2017 | Vasudevan | H04L 49/9068 |
| 2018/0314725 | A1* | 11/2018 | Subramanian | G06F 3/0619 |
| 2018/0349301 | A1* | 12/2018 | Canepa | G11C 16/26 |
| 2019/0042444 | A1* | 2/2019 | Natarajan | G06F 12/0871 |
| 2020/0042443 | A1* | 2/2020 | Keung | G06F 3/0659 |

OTHER PUBLICATIONS

European Search Report for European Application No. 19189312.2 dated Dec. 7, 2021 (12 pages).

* cited by examiner

CONTROLLING PERFORMANCE OF A SOLID STATE DRIVE

CROSS REFERENCE TO RELATED APPLICATION

This disclosure claims the benefit of priority of U.S. Provisional Application Ser. No. 62/712,804 filed Jul. 31, 2018, entitled, "METHOD TO CONTROL THE PERFORMANCE OF A SOLID STATE DRIVE (SSD) BY ADJUSTING NAND WAITING AND POLLING TIME", the contents of which is incorporated herein by reference in its entirety.

FIELD OF USE

This disclosure relates to controlling performance of a solid state drive (SSD), namely controlling latency and throughput of the SSD.

BACKGROUND

A solid-state drive (SSD) is a data storage device that uses non-volatile memory such as NAND (Not-And) or NOR (Not-Or) non-volatile memory to store persistent digitally encoded data. The SSD is configured to emulate a hard disk drive, i.e., a device that stores persistent digitally encoded data on magnetic surfaces of rapidly rotating platters and replaces a hard disk drive (HDD) in many applications.

A host is typically coupled to the SSD to read data from the SSD, write data to the SSD, and erase data from the SSD. To facilitate the reading, writing, and erasing of the data, the SSD has an SSD controller with a host interface for communicating with the host and a non-volatile memory interface for managing the non-volatile memory. The host interface includes addressing, a data bus, and control for communicating with the host and conforms to a data communication protocol such as Serial Advanced Technology Attachment (SATA), Serial Attached Small Computer System Interface (SAS), Non-Volatile Memory Express (NVMe) or Universal Serial Bus (USB), while the non-volatile memory interface includes addressing, a data bus, and control for managing the non-volatile memory and conforms to a data communication protocol such as open NAND flash interface (ONFI) for NAND non-volatile memory.

The host issues write, read, and erase requests to perform a write, read, and erase operation, respectively, on the SSD. To perform the write operation, the host sends a write request to the SSD. The write request indicates data to write and a data address where to write the data. The write request is received at the host interface of the SSD. The SSD controller then executes hardware and/or firmware to write the data in the non-volatile memory based on the data address, via the non-volatile memory interface. To perform the read operation, the host sends a read request to the SSD. The read request indicates a data address to read. The read request is received at the host interface of the SSD. The SSD controller executes hardware and/or firmware to read data in the non-volatile memory based on the data address. The SSD controller receives the data that is read from the non-volatile memory via the non-volatile memory interface and provides the read data to the host via the host interface. To perform the erase operation, the host sends an erase request to the SSD. The erase request indicates a data address to erase. The erase request is received at the host interface of the SSD. The SSD controller executes hardware and/or firmware to perform an erase operation in the non-volatile memory based on the data address.

The SSD has a latency and throughput that depends on a type of non-volatile memory used by the SSD. For example, NOR non-volatile memory might read and/or write data faster than NAND non-volatile memory. The SSD also has a latency and throughput that depends on an SSD controller implementation. SSD controllers may be designed with different firmware parameters associated with reading and/or writing data, have different non-volatile memory interface speeds, and have different host interface speeds. In this regard, SSDs using different controllers or different types of non-volatile memory will perform differently.

A manufacturer builds SSDs with the different SSD controllers and non-volatile memory types depending on cost and/or component availability. In this regard, the SSDs from the same manufacturer will perform differently depending on components in the SSD. Because the SSDs use different components, the manufacturer cannot guarantee a same level of latency and throughput of the SSDs, even though in some situations customers might expect a same level of performance.

SUMMARY

This disclosure relates to controlling performance of solid state drives (SSD), namely controlling latency and throughput of SSDs by adjusting wait time duration and/or polling time duration associated with reading, writing, and/or erasing data in the non-volatile memory of the SSD. The adjustment of the wait time duration and/or polling time duration allows for controlling performance of SSDs even though the SSDs use different SSD controller implementations or non-volatile memory types.

According to an aspect of the described system and techniques, a method comprises receiving a storage access request to access a solid state drive (SSD); setting a non-volatile memory access timer with a time duration, wherein the time duration is based on a desired performance of the SSD; sending a non-volatile memory command associated with the storage access request to non-volatile memory; starting the non-volatile memory access timer; determining whether the non-volatile memory completed execution of the non-volatile memory command after the non-volatile memory access timer indicates that the time duration elapsed; providing an indication that the storage access request is complete if the non-volatile memory completed execution of the non-volatile memory command; and resetting the non-volatile memory access timer based on the time duration if the non-volatile memory has not completed execution of the non-volatile memory command.

According to another aspect of the described system and techniques, a non-transitory computer-readable medium storing instructions that, when executed by one or more processors, cause the one or more processors to at least: receive a storage access request to access a solid state drive (SSD); set a non-volatile memory access timer with a time duration, wherein the time duration is based on a desired performance of the SSD; send a non-volatile memory command associated with the storage access request to non-volatile memory; start the non-volatile memory access timer; determine whether the non-volatile memory completed execution the non-volatile memory command after the non-volatile memory access timer indicates that the time duration elapsed; provide an indication that the storage access request is complete if the non-volatile memory completed execution of the non-volatile memory command; and reset the non-volatile memory access timer based on the time duration if the non-volatile memory has not completed execution of the non-volatile memory command.

According to yet another aspect of the described system and techniques, an SSD comprises: an SSD controller having a non-volatile memory access timer; a non-volatile memory; instructions stored in memory of the SSD controller and that, when executed by one or more processors of the SSD controller, cause the SSD controller to at least: receive a storage access request to access the SSD; set the non-volatile memory access timer with a time duration, wherein the time duration is based on a desired performance of the SSD; send a non-volatile memory command associated with the storage access request to the non-volatile memory; start the non-volatile memory access timer; determine whether the non-volatile memory completed execution of the non-volatile memory command after the non-volatile memory access timer indicates that the time duration elapsed; provide an indication that the storage access request is complete if the non-volatile memory completed execution of the non-volatile memory command; and reset the non-volatile memory access timer based on the time duration if the non-volatile memory has not completed execution of the non-volatile memory command.

In this regard, mechanisms are provided for controlling performance of SSDs.

Figure 1:
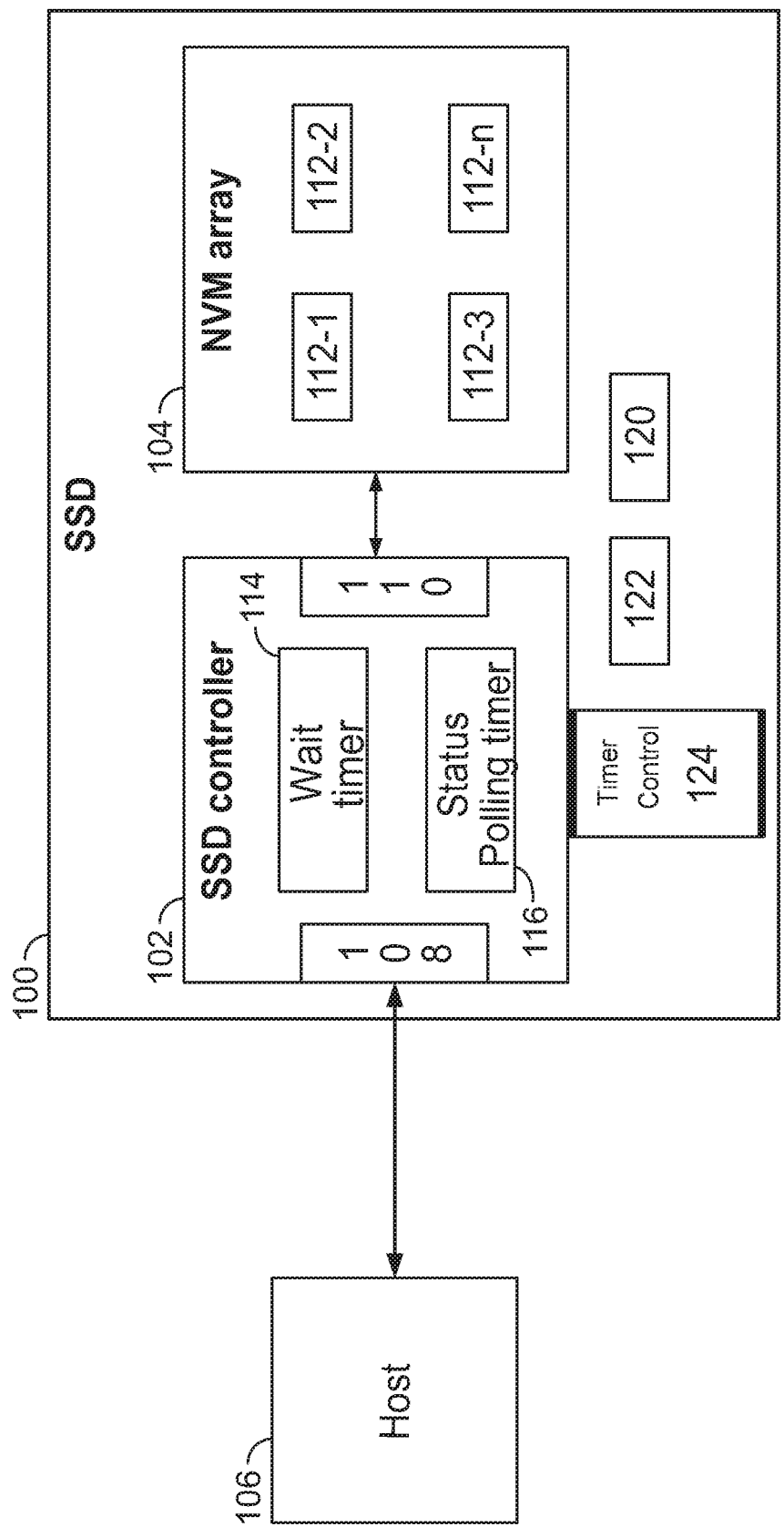
FIG. 1 is an example solid state drive (SSD) arranged with functionality to control performance of the SSD.

The drawings are for the purpose of illustrating example embodiments, but it is understood that the embodiments are not limited to the arrangements and instrumentality shown in the drawings.

DETAILED DESCRIPTION

This disclosure provides examples and details for controlling performance of a solid state drive (SSD), namely controlling latency and throughput associated with read, write, and erase operations on the SSD, by controlling a wait time duration and polling time duration associated with non-volatile memory of the SSD. The latency may be indicative of a delay to complete a read, write, or erase operation and the throughput may be indicative of a rate by which the operations are completed. By controlling the wait time duration and the polling time duration, SSDs that use different SSD controller implementations or non-volatile memory types may be arranged to have similar performance. The principles described herein may be applied to controlling performance of other type of storage devices, such as a hard disk drive (HDD) or hybrid SSD/HDD drives where a storage medium is accessed.

FIG. 1 illustrates an example SSD arranged with functionality to control latency and throughput of the SSD. The SSD 100 includes an SSD controller 102 and non-volatile memory (NVM) array 104. The SSD 100 is coupled to a host 106 such as a computer system for performing read, write, and erase operations on the SSD 100.

The SSD controller 102 has a host interface 108 and a non-volatile memory interface 110. The host interface 108 facilitates communicating with the host 106. The host interface 108 may include addressing, a data bus, and control for communicating with the host 106 and conforms to a data communication protocol such as Serial Advanced Technology Attachment (SATA), Serial Attached Small Computer System Interface (SAS), Non-Volatile Memory Express (NVMe) or Universal Serial Bus (USB). For example, the host interface 108 receives data to be stored on the SSD 100 from the host 106 and transmits data stored on the SSD 100 to the host 106. The non-volatile memory interface 110 facilitates management of the non-volatile memory array 104. The non-volatile memory interface 110 may include addressing, a data bus, and control for managing the non-volatile memory array 104 and conforms to a data communication protocol such as open NAND ("Not-And") flash interface (ONFI) for NAND flash. The SSD controller 102 may facilitate performing read, write, and erase operations on the non-volatile memory array 104.

During a write operation, the host 106 may want to write data to the SSD 100. The SSD controller 102 receives this data from the host 106 via a write request which may also identify a logical block address (LBA) where to write the data. The SSD controller 102 may map the LBA to a physical address in the non-volatile memory array 104 and cause the non-volatile memory array 104 to write the data to the corresponding physical address. The SSD 100 may have one or more of volatile memory 120, nonvolatile memory 122, or other memory (e.g., memory within the SSD controller) to store mapping information that associates an LBA with a physical address.

During a read operation, the host 106 may want to read data from the SSD 100. For example, the host 106 may send a read request to the SSD controller 102 with a logical block address (LBA) where to read the data. The SSD controller 102 receives the read request from the host 106. The SSD controller 102 may map the LBA to a physical address in the non-volatile memory array 104 and cause the non-volatile memory array 104 to read the data from the corresponding physical address and provide it to the SSD controller 102. The SSD controller 102 may then provide the read data to the host 106 via the host interface 108.

During an erase operation, the host 106 may want to erase data from the SSD 100. For example, the host may send an erase request to the SSD controller 102 with an LBA where data is to be erased. The SSD controller 102 receives the erase request from the host 106. The SSD controller 102 may map the LBA to a physical address in the non-volatile memory array 104 and cause the non-volatile memory array 104 to erase the data from the corresponding physical address in the non-volatile memory array 104.

The non-volatile memory array 104 may include one or more non-volatile memory 112-1, 112-2, 112-3 . . . 112-$n$, referred to collectively as non-volatile memory 104 or the non-volatile memory array 104. In some examples, each non-volatile memory 112-1 . . . 112-$n$ may store data in a plurality of blocks, and each of the blocks includes a plurality of addressable pages. Each of the addressable pages is a physical memory location that corresponds to a physical address, which in turn is associated with an LBA. Accordingly, each LBA written to or read by the host 106 corresponds to a physical location in one of the non-volatile memories 112-1 ... 112-n that is accessed according to one of the addressable pages. The non-volatile memory array 104 may implement NAND non-volatile memory, NOR (Not-Or) non-volatile memory, a combination of NAND and NOR non-volatile memory, or other types of storage media.

The SSD controller 102 may also have one or more non-volatile memory timers, shown as a wait timer 114 and status polling timer 116. The non-volatile memory timer may be set with a given time duration and provide an indication when the given time duration has elapsed after starting the non-volatile memory timer. For example, the non-volatile memory timer may be set with the given time duration (e.g., 80 microseconds) and the non-volatile memory timer started. The non-volatile memory timer may have a counter or timer for determining that the given time duration elapsed since when the non-volatile memory timer was started. After the time duration elapsed, the non-volatile memory timer provides the indication.

The non-volatile memory timer in the form of the wait timer 114 and status polling timer 116 are used to facilitate reading, writing, and/or erase operations in the non-volatile memory array 104. The wait timer 114 and status polling timer 116 may be set to a respective time duration and started when a read, write, or erase command is issued to the non-volatile memory 104 array as part of the read, write, or erase operation. The wait timer 114 and status polling timer 116 may provide respective indications when the respective time duration has elapsed. After the time duration of the wait timer 114 and/or status polling timer 116 elapses, SSD controller 102 may perform a status polling to determine completion of the read, write, or erase command by the non-volatile memory array 104. If the SSD controller 102 determines that the read, write, or erase command is complete, then SSD provides an indication to the host 106 via the host interface 108 that the read, write, or erase operation is complete. Otherwise, the wait timer 114 and status polling timer 116 may be reset and the SSD controller 102 may perform additional status polling requests based on the wait timer 114 and status polling timer 116 until the read, write, or erase command is complete.

In examples, the SSD controller 102 may have a timer controller 124 to facilitate setting the wait timer 114 and/or status polling timer 116 with the time duration to control performance of the SSD 100, such as latency and/or throughput, during storage operations such as the read, write, or erase operation. The latency may be indicative of a delay to complete the read, write, or erase operation and the throughput may be indicative of a rate by which the read, write, or erase operation is completed. Setting the wait timer 114 and/or status polling timer 116 with a longer time duration results in a longer latency and/or less throughput of the SSD 100. Setting the wait timer 114 and/or status polling timer 116 with a shorter time duration results in a shorter latency and/or more throughput of the SSD 100. SSD controller 102 is shown to have both a wait timer 114 and status polling timer 116, but in some examples, the SSD controller 102 may have one or the other timer, or additional timers. In other examples, the wait timer 114 and status polling timer 116 may be located on other systems of the SSD 100.

Example Operations

Setting the non-volatile memory access timer with the given time duration allows for artificially tuning the SSD to meet performance criteria such as a latency and/or throughput of the SSD. The given time duration may set in many ways, examples of which are provided below.

In various examples, the given time duration of the non-volatile memory access timer may be set based on a configuration of the SSD such as the non-volatile memory in the SSD or SSD controller implementation. For example, an SSD with NOR non-volatile memory might read and/or write data faster than an SSD with NAND non-volatile memory. If the SSD has a NAND non-volatile memory, the time duration may be set to one time value stored in the SSD controller 102 while if the SSD has a NOR non-volatile memory, the time duration may be set to another time value stored in the SSD controller 102 to achieve a desired performance of the SSD for the configuration of the SSD. As another example, SSD controllers may be designed with different firmware parameters associated with reading and/or writing data, have different non-volatile memory interface speeds, and have different host interface speeds. The wait timer and/or polling timer may be set with respective time durations to achieve a desired performance of the SSD for the configuration of the SSD controller.

For example, the SSD controller may store a mapping of different host interface speeds, non-volatile memory interface speeds, and/or firmware parameters of the SSD to different time durations. Based on a current host interface speed, non-volatile memory interface speed, and/or firmware parameters of the SSD, the SSD controller may identify the mapped time durations and set the wait timer and/or status polling timer with the time durations. The polling time duration and/or wait time duration may be increased to increase latency and decrease throughput while the polling time duration and/or wait time duration may be decreased to decrease latency and increase throughput to achieve a desired performance of the SSD for the configuration of the SSD. In this regard, latency and/or throughput of the SSD may be artificially controlled by changing one or more of the polling time duration and wait time duration. Further, by controlling the wait time duration and the polling time duration, SSDs that use different SSD controller implementations or non-volatile memory may be arranged to have similar performance. For example, if one SSD has different components than another SSD, one or more of the polling time duration and wait time duration for each SSD may be set so that performance of each SSD is similar despite use of the different components.

In various examples, the wait time duration and/or polling time duration may be set based on a storage access request. For example, the storage access request may be a read request to read data stored in the SSD, a write request to write data to the SSD, or an erase request to erase data in the SSD. The time duration may be set so that the SSD meets performance criteria associated with the SSD.

Figure 2:
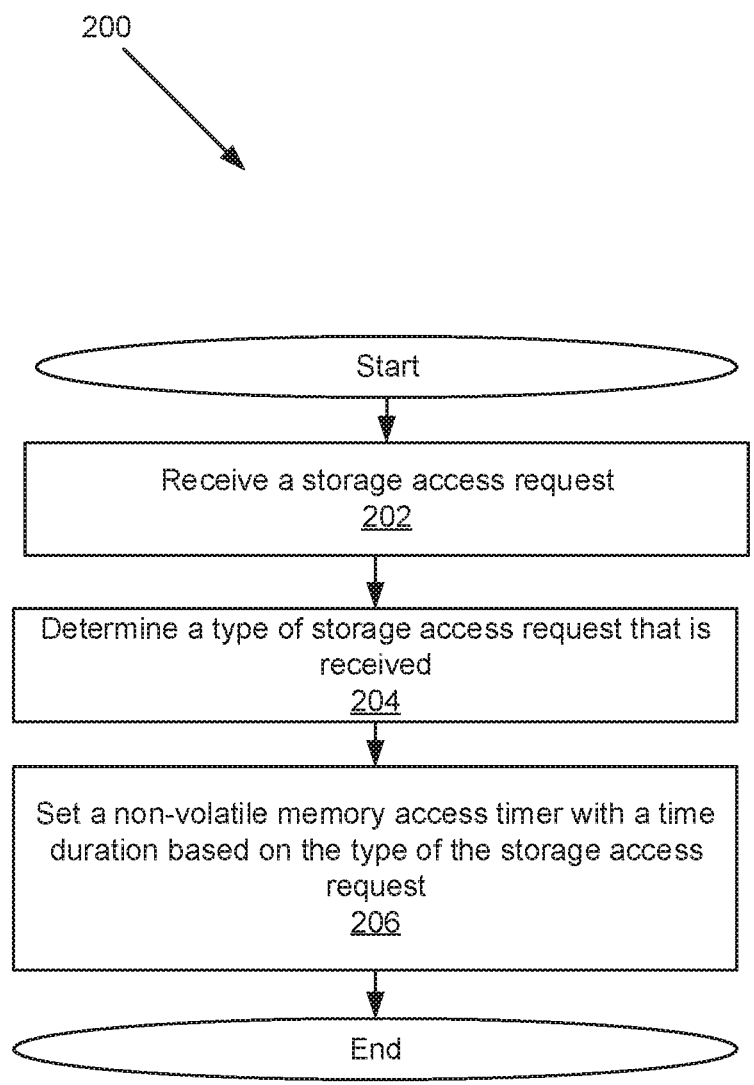
FIG. 2 is a flow chart of example functions associated with setting a non-volatile memory timer with a time duration to control performance of the SSD.

FIG. 2 is a flow chart of example functions associated with setting the wait time duration and/or polling time duration to control performance of the SSD based on the storage access request. The functions may be implemented by the SSD controller in hardware, firmware, and/or a combination of hardware and firmware.

At 202, a storage access request is received. The storage access request may be received from a host at a host interface of the SSD controller.

At 204, a determination is made as to the type of the storage access request that is received. The storage access request may be a read request, write request or erase request. Each type of storage access request may be associated with a given time duration associated with the wait timer and status polling timer such as a respective wait time duration and polling time duration stored in the SSD controller.

At 206, the non-volatile memory access timer is set with a time duration based on the type of the storage access request. For example, if the type of storage access request is a write request and the non-volatile memory access timer is a status polling timer, then the status polling timer may be set to a polling time duration stored in the SSD controller which is associated with the write request. As another example, if the type of storage access request is a write request and the non-volatile memory access timer is a wait timer, then the wait timer may be set to a wait time duration stored in the SSD controller which is associated with the write request. The wait timer and status polling timer may be similarly set to the respective wait time duration and polling time duration associated with the read request or erase request if the storage access request is a read request or erase request. In some examples, the wait time duration may be the same for each of the requests and the polling time duration may differ.

In various examples, the wait time duration and/or polling time duration may be defined by a configuration command. The configuration command may be indicative of a desired performance of the SSD.

Figure 3:
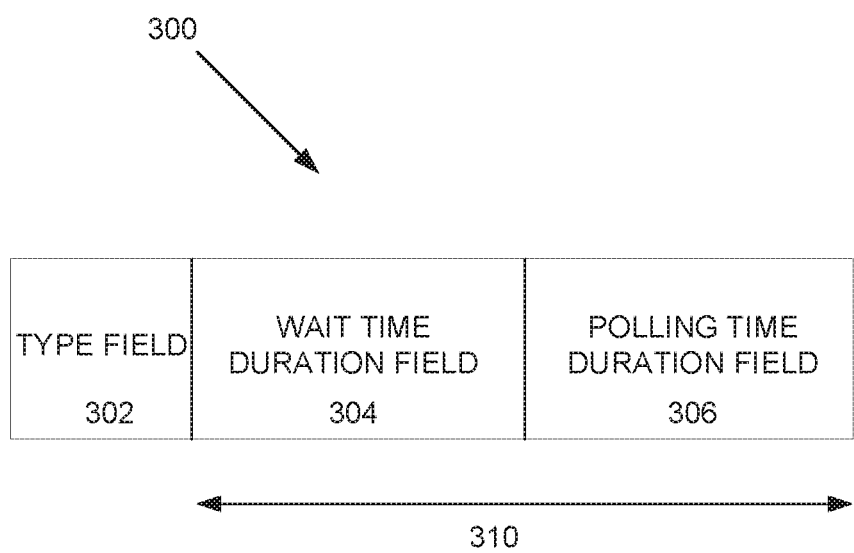
FIG. 3 is an example of a configuration command which defines the time duration.

FIG. 3 is an example of a configuration command that might be used to set the time duration. The configuration command 300 may be sent from the host or generated by the SSD controller. The configuration command 300 may include a type field 302 and a timer field 310. The type field 302 may indicate that the command is a configuration command by a unique code such as string of bits. The timer field 310 may define one or more time durations. As illustrated, the timer field 310 may take the form of one or more of a wait time duration field 304 and a polling time duration field 306, both of which are shown in the configuration command 300. The wait time duration field 304 and a polling time duration field 306 may indicate the wait time duration and polling time duration associated with the wait timer and status polling timer, respectively. Based on identification of the configuration command by the type field, the SSD controller may set the respective non-volatile memory timer with the time durations in the timer field 310. For example, the wait timer may be set with the wait time duration in the wait time duration field 304 and the status polling timer may be set with the polling time duration in the polling time duration field 306.

In some examples, the SSD controller may store an indication of a preset polling time duration and preset wait time duration in memory which is then accessed and associated with the status polling timer and wait timer respectively. The configuration command may provide an indication to select a particular preset polling time duration and preset wait time duration from a plurality of options stored on the SSD controller rather than specifying an actual polling time duration and wait time duration in the configuration command itself. This way firmware overhead for obtaining the wait time duration or polling time duration is reduced since the time durations are already stored locally, for example, in a register of the SSD controller.

Figure 4:
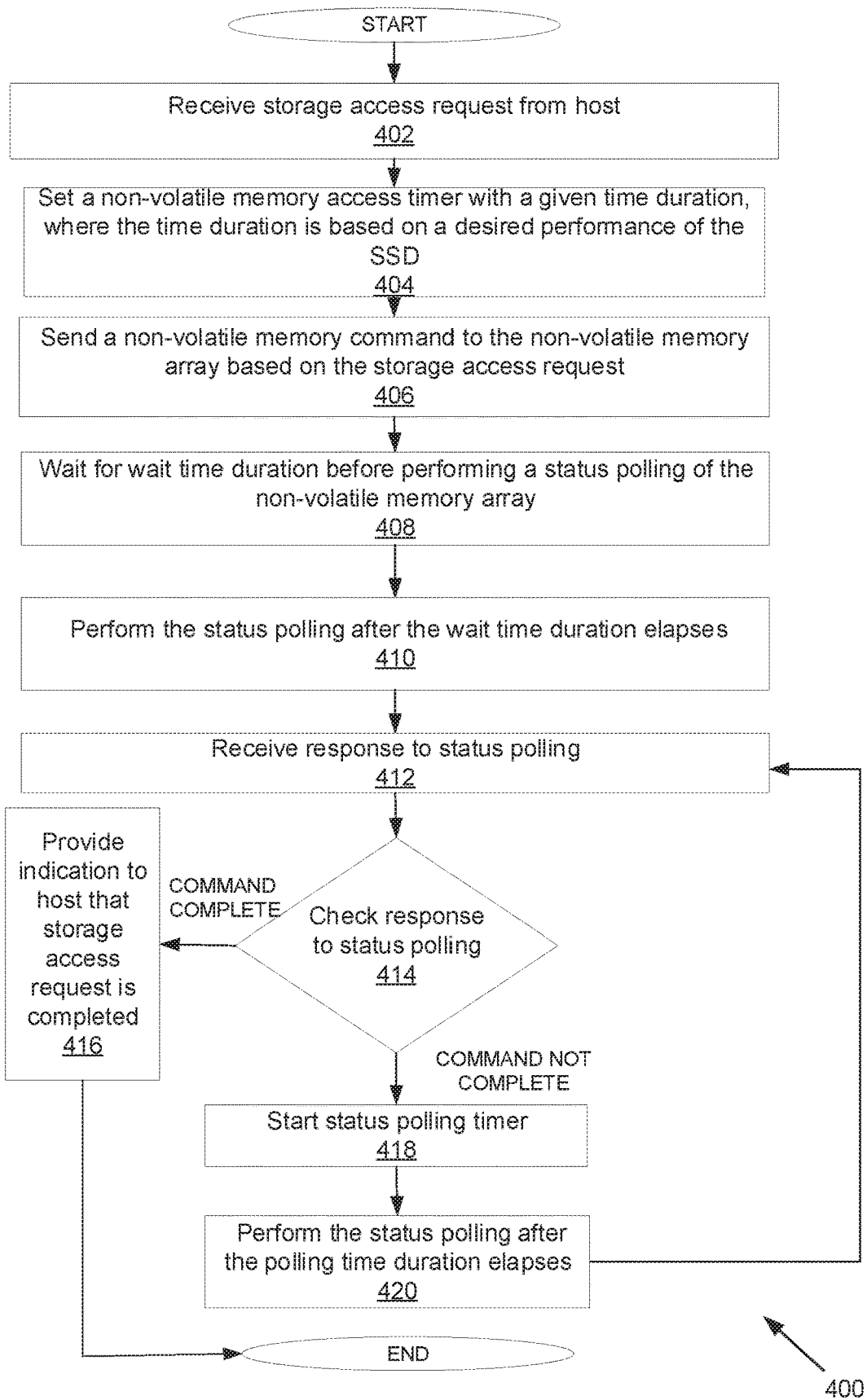
FIG. 4 is a flow chart of example functions associated with controlling performance of the SSD.

FIG. 4 is an example flow chart 400 of example functions associated with controlling performance of the SSD by setting the wait timer and/or status polling timer associated with storage operations. The functions may be implemented on the SSD controller in firmware, hardware, or a combination of firmware and hardware. Setting the wait timer and/or status polling timer with a given time duration allows for artificially tuning the SSD to meet performance criteria such as a latency and/or throughput of the SSD.

At 402, the SSD controller receives a storage access request from the host. The host interface of the SSD controller may receive the storage access request. The storage access request may take many forms. For example, the storage access request may be the read request with an indication of a logical address associated with the data to be read. As another example, the storage access operation may be the write request with an indication of the data to write to the SSD and the logical address where the data is to be written. As another example, the storage access operation may be an erase request with an indication of the logical address having the data to be erased. The storage access request may take other forms as well.

At 404, the SSD controller sets a non-volatile memory access timer with a given time duration, where the given time duration is based on a desired performance of the SSD. The non-volatile memory access timer may take the form of the wait timer and/or status polling timer. The wait timer and status polling timer may be set with a respective wait time duration and polling time duration to control the performance of the SSD. The respective wait time duration and polling time duration may be determined in many ways as described above. The setting of the wait timer and status polling timer with the respective wait time duration and polling time duration artificially tunes the SSD to meet performance criteria such as a latency and/or throughput of the SSD.

At 406, the SSD controller sends a non-volatile memory command to the non-volatile memory array based on the storage access request. For example, a read command may identify the physical address in the non-volatile memory to be read which corresponds to the logical address to be read, indicated by the read request. As another example, a write command may identify the physical address in the non-volatile memory to be written to which corresponds to the logical address to be written to and the data to write, indicated by the write request. In yet another example, an erase command may identify the physical address in the non-volatile memory to be erased which corresponds to the logical address to be erased, indicated by the erase request. After the non-volatile memory command is sent, at 408, the SSD controller may start the wait timer and wait for the wait time duration before performing status polling of the non-volatile memory array to determine if execution of the non-volatile memory command is completed by the non-volatile memory array. It is recommended to wait for a certain period of time before checking whether execution of the command is complete because if too many status pollings are issued, bandwidth of the non-volatile memory array is not efficiently utilized. In this regard, the wait timer may indicate whether the status polling should be performed. For example, wait timer may be set to the time duration equal to the wait time duration and started. The wait timer may indicate that the time associated with the wait time duration has elapsed, at which point the status polling should be performed, and not performed otherwise.

At 410, the SSD controller performs the status polling after the wait time duration elapses. The status polling is a check on a status of whether the non-volatile memory array has completed execution of the non-volatile memory command. The status polling may take the form of checking a register in the non-volatile memory which indicates whether the execution is complete. As another example, the status polling may take the form of sending a status message to the non-volatile memory requesting an indication whether the execution is complete.

At 412, a response to the status polling is received and, at 414, the response to the status polling is checked. The response may be a message from the non-volatile memory which indicates whether execution is complete or a result of checking the register which indicates whether execution is complete. If the response indicates that execution of the non-volatile memory command is complete, then at 416, an indication is provided to the host that the storage access request is complete. For example, if the non-volatile memory command is a read command, then the execution is complete when the data to be read is available to the SSD controller. As another example, if the non-volatile memory command is a write command, then the execution is complete when the data is written to the non-volatile memory. In yet another example, if the non-volatile memory command is an erase command, then the execution is complete when the data to be erased is erased by the non-volatile memory. If the non-volatile memory command is a read command, the SSD controller may request the read data from the non-volatile memory which is provided to the SSD controller. The indication to the host may be the data that is read. For write or erase requests, the indication may be a message or status indication that the respective write or erase request has been performed.

In some examples, the non-volatile memory array may not have completed execution of the non-volatile memory command even after the SSD controller performs the initial status polling. In such a case, the SSD controller performs additional status polling requests. The status polling timer controls how frequently the controller shall issue the additional status polling requests.

The status polling timer may be set to the time duration equal to the polling time duration at 404. At 418, the SSD controller may start the status polling timer and wait for the polling time duration to elapse. At 420, the status polling timer may indicate that the polling time duration has elapsed, at which point the status polling is performed, and not performed otherwise. After the status polling is performed, processing may continue to 412. Blocks 412, 414, 418, and 420 are executed until the host is provided with an indication that the storage access request is complete at block 416.

In some examples, block 418 may include setting the status polling timer with the polling time duration before starting the status polling timer if the status polling timer is not set with the polling time duration before being started. In some examples, the SSD controller may vary the polling time duration after one or more times the status polling timer is reset for the storage access operation. For instance, the SSD controller may have a counter which counts how many times the status polling has been performed for the storage access request. The status polling timer duration may be increased and/or decreased based on the count so that performance criteria is met and latency and/or throughput of the SSD is fine tuned.

The time duration which the wait timer and status polling timer are set allows for controlling a latency and throughput of the SSD. For example, setting the wait timer to a longer wait time duration and/or setting the status polling timer to a longer polling time duration may increase a time to perform the storage access operation. As another example, setting the wait timer to a shorter wait time duration and/or setting the status polling timer to a shorter polling time duration may decrease a time to perform the storage access operation. This way performance of the SSD may be adjusted for various SSD controller and/or non-volatile memory configurations so that performance across a plurality of SSDs is the same or different.

Figure 5:
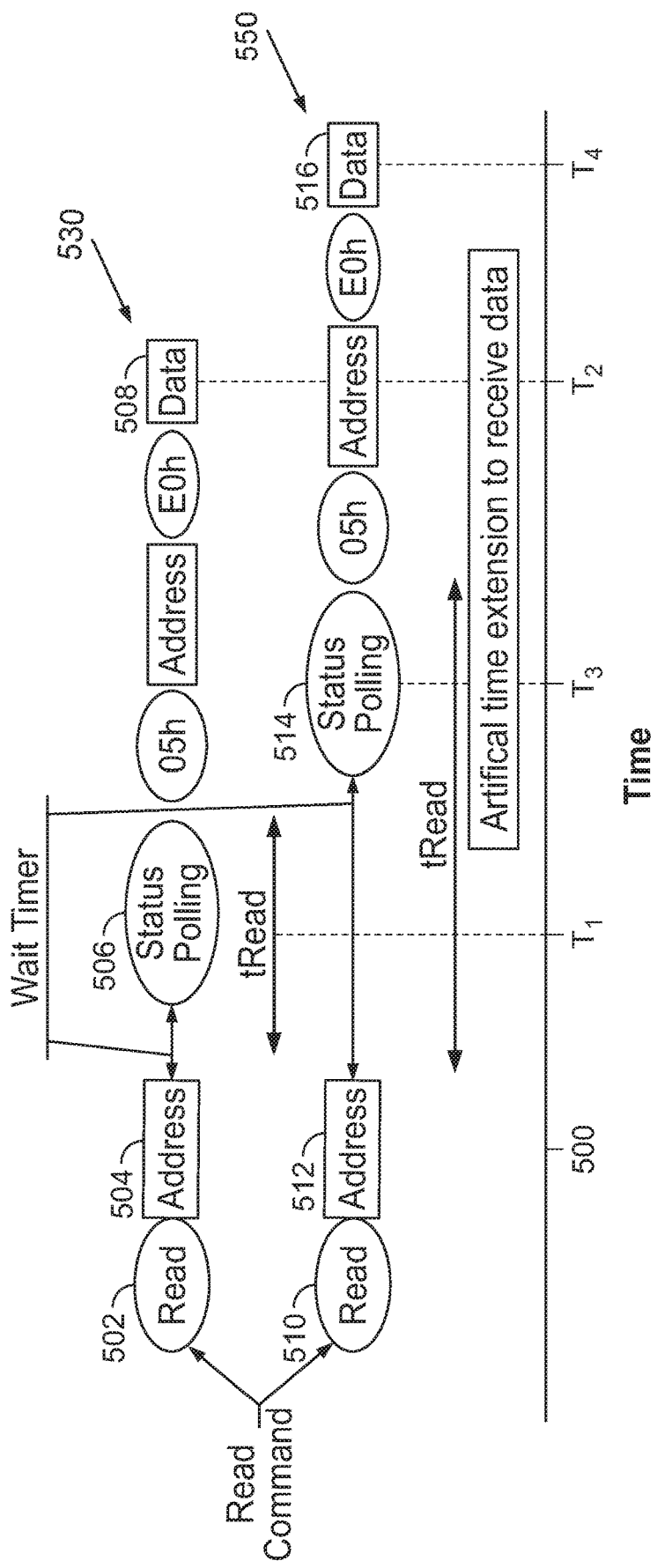
FIGS. 5 and 6 illustrate how setting an example non-volatile memory timer in the form of a wait timer with a wait time duration changes latency and throughput of the SSD.

FIG. 5 illustrates graphically how the setting of the wait time duration of the wait timer might change latency and/or throughput performance of the SSD. Two message flows 530 and 550 are shown as a result of issuing a read command 502. A horizontal axis 500 indicates time.

Message flow 530 is associated with a first wait time duration. At 502, a read request is received and at 504, an address associated with the data to read is received. The wait timer may be set with the wait time duration. The read command is issued to the non-volatile memory array and at 506, a status polling performed at T1 after the wait timer indicates that the wait time duration has elapsed. A response to the status polling performed at T1 may indicate that the read command has been completed. If execution of the read operation is complete, then the SSD controller may request that the non-volatile memory array provide the data to be read which is received at T2. An example of the request is shown as "05h, Address, E0h" which results in data 508 being received.

If the wait time duration is increased, then the latency and performance of the SSD increases. Message flow 550 is associated with a second wait time duration longer than the first wait time duration. At 510, a read request is received and at 512, an address associated with the data to read is received. The wait timer may be set with the wait time duration which is longer than the wait time duration described in the flow 530. The read command is issued to the non-volatile memory array and at 514, a status polling performed at T3 after the wait timer indicates that the wait time duration elapsed. T3 is after T1, indicating that the wait time is longer. A response to the status polling performed at T3 may indicate that the read command has been completed. If execution of the read operation is complete, then the SSD controller may request that the non-volatile memory array provide the data to be read which is received at T4. An example of the request is shown as "05h, Address, E0h" which results in data 516 being received.

In message flow 550, the data is not received until T4 which is longer than T2 because the time associated with the wait time duration is longer. In this regard, a wait time duration associated with wait timer may be directly related to a read time (tRead) and latency and/or throughput of reading data from the SSD. Similarly, a polling time duration associated with the status polling timer (not shown) may be directly related to the latency and throughput of reading data from the SSD. For example, one or more status polling requests may be sent to the non-volatile memory, each separated by a polling time duration until the read operation is complete. Further, the wait time duration and polling time duration are directly related to latency and throughput of writing and erasing data in the SSD.

Figure 6:
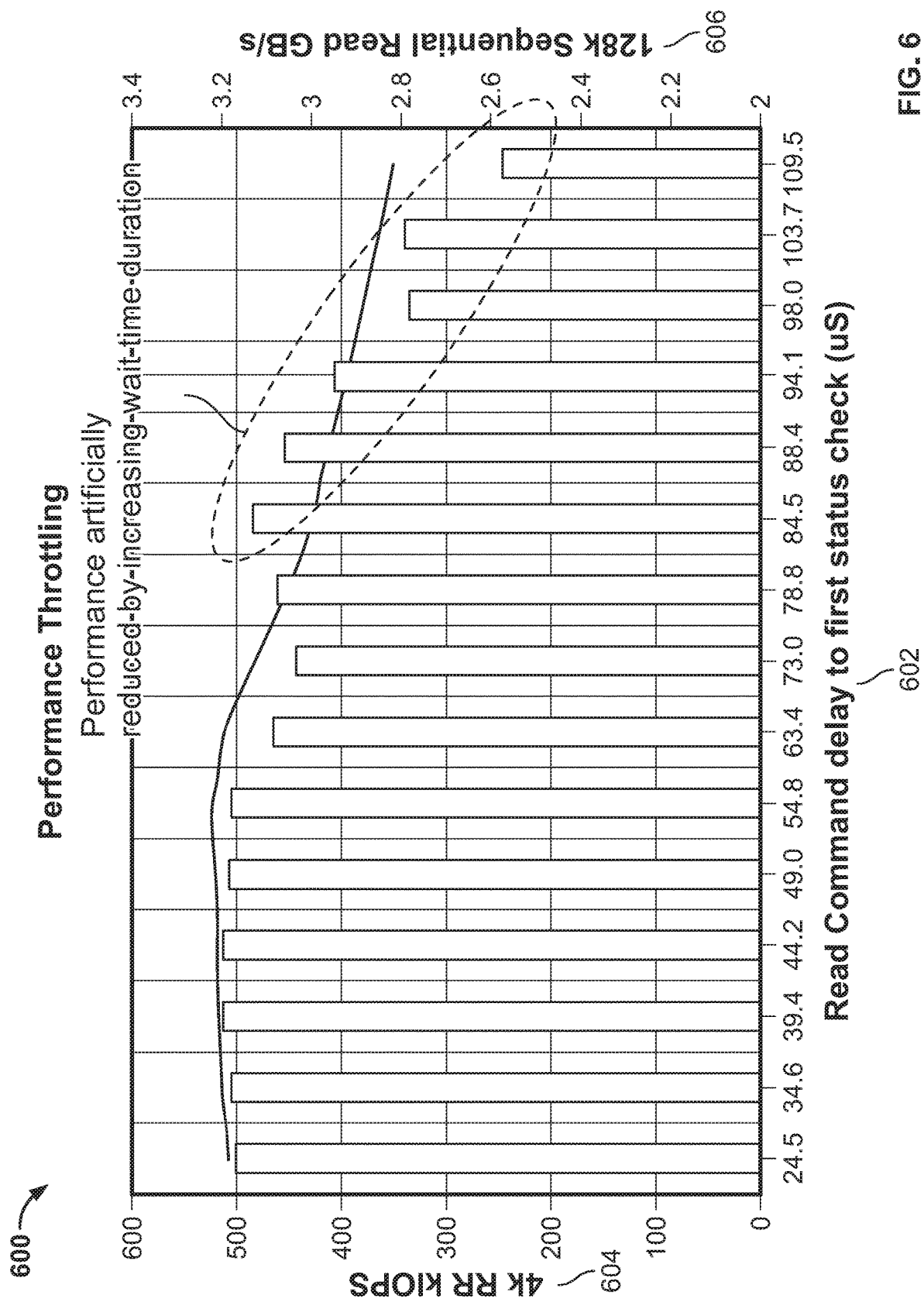

FIG. 6 shows an example of how the performance of the SSD changes with a change of the wait time duration. The horizontal axis 602 shows the wait timer set to different wait time durations ranging from 24.5 microseconds to 109.5 microseconds for a read command. The axis 604 shows how latency in terms of data rate associated with 128K sequential reads may decrease as the wait time duration (also referred to as "delay to first status check") increases. The axis 606 shows how throughput in terms of kilo input output operations (kIOPS) may decrease as the wait time duration increases. This decrease becomes apparent generally after the wait time duration exceeds 84.5 microseconds. In this regard, adjusting the wait time duration allows for configuration of the latency and/or throughput of the SSD. Performance of the SSD may similarly change by setting the status polling timer to different polling time durations.

Example Apparatus

Figure 7:
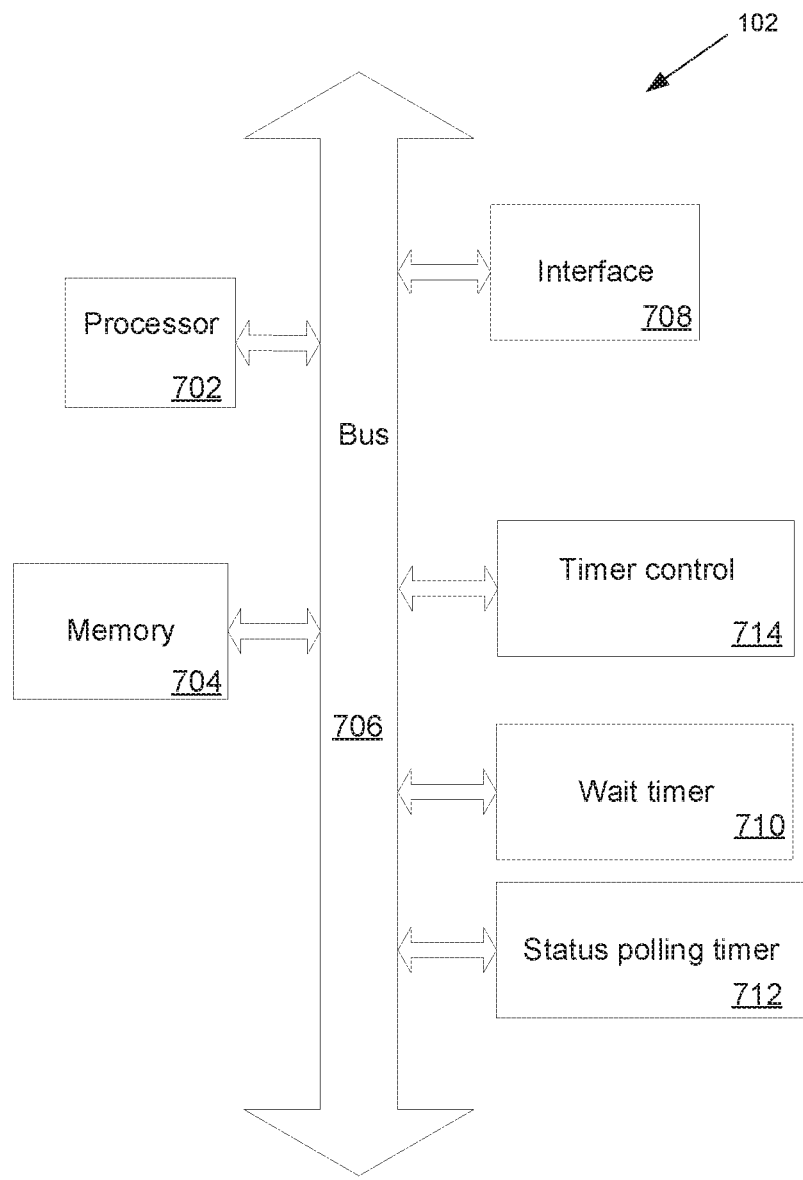
FIG. 7 is a block diagram of an example SSD controller for controlling performance of the SSD.

FIG. 7 is a block diagram of an example SSD controller 102 for controlling performance of the SSD. The SSD controller 102 includes a processor 702 (possibly including multiple processors, multiple cores, multiple nodes, and/or implementing multi-threading, etc.). The SSD controller 102 includes memory 704. The memory 704 may be system memory (e.g., one or more of cache, random access memory (RAM), synchronous RAM (SRAM), dynamic RAM (DRAM), zero capacitor RAM, Twin Transistor RAM, embedded DRAM (eDRAM), extended data output RAM (EDO RAM), double data rate RAM (DDR RAM), electrically erasable programmable read only memory (EEPROM), Nano-RAM (NRAM), resistive RAM (RRAM), silicon-oxide-nitride-oxide-silicon memory (SONOS), parameter random access memory (PRAM), etc.) or any one or more other possible realizations of non-transitory machine-readable media/medium. In examples, the memory 704 may store timer durations which are used to set the non-volatile memory timer. In examples, the stored timer durations may be associated with different SSD configurations and/or different storage commands. The association facilitates identifying the timer duration associated with the current configuration of the SSD or storage access request being executed and setting the non-volatile memory timer with the identified timer duration. In some examples, the memory 704 may include registers to store an indication of a wait time duration and/or polling time duration for setting the wait timer and status polling timer.

The SSD controller 102 also includes a bus 706 (e.g., Peripheral Component Interconnect (PCI), Industry Standard Architecture (ISA), PCI-Express, New Bus (NuBus), etc.). Coupled to the bus 706 is interface 708 which facilitates communication with the non-volatile memory array of the SSD and the host. In this regard, the interface 708 may include the host interface and the non-volatile memory interface. The SSD controller 102 may have a wait timer 710 and status polling timer 712.

A timer control 714 of the SSD controller 102 may implement any one of the previously described functionalities for setting the timers to control performance of the SSD partially, (or entirely) in hardware and/or software (e.g., computer code, program instructions, program code, computer instructions) stored on a non-transitory machine readable medium/media. In some instances, the processor 702 and memory 704 may implement or facilitate implementing the functionalities instead of or in addition to the timer control 714. Further, realizations can include fewer or additional components not illustrated in FIG. 7 (e.g., video cards, audio cards, additional network interfaces, peripheral devices, etc.). The processor 702 and the memory 704 are coupled to the bus 706. Although illustrated as being coupled to the bus 706, the memory 704 can be coupled to the processor 702.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof: including potentially a program operable to cause one or more data processing apparatus such as a processor to perform the operations described (such as a program encoded in a non-transitory computer-readable medium, which can be a memory device, a storage device, a machine-readable storage substrate, or other physical, machine readable medium, or a combination of one or more of them).

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

Other implementations fall within the scope of the following claims.

What is claimed is:

1. A method, comprising:
   selecting a time duration based on i) a type of a non-volatile memory of a solid state drive (SSD) and ii) a desired performance of the SSD, the selected time duration associated with a time duration for accessing the SSD;

receiving a storage access request to access the SSD;
setting a non-volatile memory access timer with the selected time duration;
sending a non-volatile memory command associated with the storage access request to non-volatile memory;
starting the non-volatile memory access timer;
waiting for the non-volatile memory access timer to indicate that the selected time duration has elapsed before polling the non-volatile memory to determine whether the non-volatile memory completed execution of the non-volatile memory command, the polling being responsive to the non-volatile memory access timer indicating that the selected time duration has elapsed;
providing an indication that the storage access request is complete in response to the polling indicating that the non-volatile memory completed execution of the non-volatile memory command; and
resetting the non-volatile memory access timer in response to the polling indicating that the non-volatile memory has not completed execution of the non-volatile memory command.

2. The method of claim 1, wherein the non-volatile memory command is a read, write, or erase operation and a type of the received storage access request is a read, write, or erase request; and
wherein selecting the time duration is further based on the type of the received storage access request.

3. The method of claim 1, wherein the non-volatile memory access timer includes a wait timer and a status polling timer;
wherein setting the non-volatile memory access timer with the selected time duration comprises setting the wait timer with the selected time duration;
wherein resetting the non-volatile memory access timer comprises resetting the status polling timer with a polling time duration associated with the status polling timer; and
wherein the polling time duration is adjusted each time the status polling timer is reset.

4. The method of claim 1, wherein the selected time duration is a wait time duration until a status polling is sent to the non-volatile memory to determine if execution of the non-volatile memory command is complete;
wherein resetting the non-volatile memory access timer comprises resetting the non-volatile memory access timer with a polling time duration until another status polling is sent to the non-volatile memory to determine if execution of the non-volatile memory command is complete; and
wherein the polling time duration is adjusted for different types of non-volatile memory commands.

5. The method of claim 1, further comprising receiving a configuration command that includes a time duration field;
wherein setting the non-volatile memory access timer with the selected time duration comprises setting the time duration based on a time duration value in the time duration field.

6. The method of claim 1, wherein selecting the time duration is further based on one or more of a type of the received storage access request and a configuration of the SSD.

7. The method of claim 1, wherein selecting the time duration comprises selecting an increased time duration with respect to a previously set time duration to increase time to perform the storage request.

8. A non-transitory computer-readable medium storing instructions that, when executed by one or more processors, cause the one or more processors to at least:
select a time duration based on i) a type of a non-volatile memory of a solid state drive (SSD) and ii) a desired performance of the SSD, the selected time duration associated with a time duration for accessing the SSD;
receive a storage access request to access the SSD;
set a non-volatile memory access timer with the selected time duration;
send a non-volatile memory command associated with the storage access request to non-volatile memory;
start the non-volatile memory access timer;
wait for the non-volatile memory access timer to indicate that the selected time duration has elapsed before polling the non-volatile memory to determine whether the non-volatile memory completed execution of the non-volatile memory command, the polling being responsive to the non-volatile memory access timer indicating that the selected time duration has elapsed;
provide an indication that the storage access request is complete in response to the polling indicating that the non-volatile memory completed execution of the non-volatile memory command; and
reset the non-volatile memory access timer in response to the polling indicating that the non-volatile memory has not completed execution of the non-volatile memory command.

9. The non-transitory computer-readable medium of claim 8, wherein the non-volatile memory command is a read, write, or erase operation and a type of the received storage access request is a read, write, or erase request; and
wherein the instructions for selecting the time duration comprise instructions for selecting the time duration further based on the type of the received storage access request.

10. The non-transitory computer-readable medium of claim 8, wherein the non-volatile memory access timer includes a wait timer and a status polling timer;
wherein the instructions for setting the non-volatile memory access timer comprise instructions for setting the wait timer with the selected time duration;
wherein the instructions for resetting the non-volatile memory access timer comprise instructions for resetting the status polling timer with a polling time duration associated with the status polling timer; and
wherein the non-transitory computer-readable medium further instructions that, when executed One Or more processors, cause the one or more processors to adjust the polling time duration each time the status polling timer is reset.

11. The non-transitory computer-readable medium of claim 8, wherein the selected time duration is a wait time duration until a status polling is sent to the non-volatile memory to determine if execution of the non-volatile memory command is complete;
wherein the instructions for setting the non-volatile memory access timer comprise instructions for setting the non-volatile memory access timer withe the selected time duration;
wherein the instructions for resetting the non-volatile memory access timer comprise instructions for resetting the non-volatile memory access with a polling time duration until another status polling is sent to the non-volatile memory to determine if execution of the non-volatile memory command is complete; and wherein the non-transitory computer-readable medium further instructions that, when executed One Or more processors, cause the one or more processors to adjust the polling time duration for different types of non-volatile memory commands.

12. The non-transitory computer-readable medium of claim 8, further storing instructions that, when executed by one or more processors, cause the one or more processors to;
receive a configuration command that includes a time duration field;
wherein the instructions for setting the non-volatile memory access timer with a time duration comprises instructions for setting the time duration based on a time duration value in the time duration field.

13. The non-transitory computer-readable medium of claim 8, wherein the instructions for selecting the time duration comprise instructions for selecting the time duration further based on one or more of a type of the received storage access request and a configuration of the SSD.

14. The non-transitory computer-readable medium of claim 8, wherein the instructions for selecting the time duration comprise instructions for selecting an increased time duration with respect to a previously set time duration to increase time to perform the storage request.

15. A solid state drive (SSD), comprising:
an SSD controller having a non-volatile memory access timer;
a non-volatile memory;
instructions stored in memory of the SSD controller and that, when executed by one or more processors of the SSD controller, cause the SSD controller to at least:
select a time duration based on i) a type of a non-volatile memory and ii) a desired performance of the SSD, the selected time duration associated with a time duration for accessing the SSD;
receive a storage access request to access the SSD;
set the non-volatile memory access timer with time duration;
send a non-volatile memory command associated with the storage access request to the non-volatile memory;
start the non-volatile memory access timer;
wait for the non-volatile memory access timer to indicate that the selected time duration has elapsed before polling the non-volatile memory to determine whether the non-volatile memory completed execution of the non-volatile memory command, the polling being responsive to the non-volatile memory access timer indicating that the selected time duration has elapsed;
provide an indication that the storage access request is complete in response to the polling indicating that the non-volatile memory completed execution of the non-volatile memory command; and
reset the non-volatile memory access response to the polling indicating that the non-volatile memory has not completed execution of the non-volatile memory command.

16. The SSD of claim 15, wherein the non-volatile memory command is a read, write, or erase operation and the type of the received storage access request is a read, write, or erase request; and
wherein the instructions for selecting the time duration comprise instructions for selecting the time duration further based on the type of the received storage access request.

17. The SSD of claim 15, wherein the non-volatile memory access timer includes a wait timer and a status polling timer;
wherein the instructions for setting the non-volatile memory access time comprise instructions for setting the wait timer with the selected time duration;
wherein the instructions for resetting the non-volatile memory access timer comprise instructions for resetting the status polling timer with a polling time duration associated with the status polling timer; and
wherein the memory of the SSD controller further stores instructions that, when executed by one or more processors, cause the one or more processors to adjust the polling time duration each time the status polling timer is reset.

18. The SSD of claim 15, wherein the time duration is a wait time duration until a status polling is sent to the non-volatile memory to determine if execution of the non-volatile memory command is complete;
wherein the instructions for setting the non-volatile memory access timer comprise instructions for setting the non-volatile memory access timer with the selected time duration;
wherein the instructions for resetting the non-volatile memory access timer comprise instructions for resetting the non-volatile memory access timer with a polling time duration until another status polling is sent to the non-volatile memory to determine if execution of the non-volatile memory command is complete; and
wherein the memory of the SSD controller further stores instructions that, when executed by one or more processors, cause the one or more processors to adjust the polling time duration for different types of non-volatile memory commands.

19. The SSD of claim 15, wherein the instructions for selecting the time duration comprise instructions for selecting the time duration further based on one or more of a type of the received storage access request and a configuration of the SSD.

20. The SSD of claim 15, wherein the instructions for selecting the time duration comprise instructions for selecting an increased time duration with respect to a previously set time duration to increase time to perform the storage request.

* * * * *